United States Patent
Park et al.

(10) Patent No.: US 9,703,191 B2
(45) Date of Patent: Jul. 11, 2017

(54) METHOD OF MANUFACTURING COLOR CONVERSION SUBSTRATE

(71) Applicant: Samsung Display Co., Ltd., Yongin-si, Gyeonggi-do (KR)

(72) Inventors: Kisoo Park, Yongin-si (KR); Yongseok Kim, Yongin-si (KR); Youngmin Kim, Yongin-si (KR); Haeil Park, Yongin-si (KR); Boram Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/254,228

(22) Filed: Sep. 1, 2016

(65) Prior Publication Data
US 2017/0059985 A1    Mar. 2, 2017

(30) Foreign Application Priority Data

Sep. 2, 2015  (KR) .......................... 10-2015-0124227

(51) Int. Cl.
*G02B 5/20* (2006.01)
*G03F 7/00* (2006.01)
(Continued)

(52) U.S. Cl.
CPC ......... *G03F 7/0002* (2013.01); *G02B 5/0294* (2013.01); *G02B 5/201* (2013.01);
(Continued)

(58) Field of Classification Search
CPC .... G03F 7/0007; G03F 7/0035; G03F 7/2002; G02B 5/201; G02B 5/223;
(Continued)

(56) References Cited

U.S. PATENT DOCUMENTS

| | | | |
|---|---|---|---|
| 6,690,107 B1* | 2/2004 | Van Doorn ........... | H01J 9/2271 313/466 |
| 2008/0044773 A1* | 2/2008 | Kawamura ............ | G02B 5/201 430/314 |

(Continued)

FOREIGN PATENT DOCUMENTS

| KR | 1020100093860 A | 8/2010 |
|---|---|---|
| KR | 1020140135755 A | 11/2014 |

(Continued)

OTHER PUBLICATIONS

Computer-generated translation of WO 2010/010730 (Jan. 2010).*

*Primary Examiner* — John A McPherson
(74) *Attorney, Agent, or Firm* — Cantor Colburn LLP

(57) ABSTRACT

A method of manufacturing a color conversion substrate includes preparing a substrate including a first pixel region, a second pixel region, and a third pixel region, forming a first color conversion portion corresponding to the first pixel region, forming a second color conversion portion corresponding to the second pixel region, and forming a third color conversion portion corresponding to the third pixel region. The providing the first color conversion portion includes providing a first color filter of a first color corresponding to the first pixel region, providing a first transparent pattern corresponding to the first pixel region, and providing a first pattern layer corresponding to the first pixel region and including a first material which converts light incident thereto into light of the first color, where the first transparent pattern is provided between the first color filter and the first pattern layer.

18 Claims, 14 Drawing Sheets

(51) Int. Cl.
  *G03F 7/20* (2006.01)
  *G02B 5/22* (2006.01)
  *G02B 5/26* (2006.01)
  *G02B 5/02* (2006.01)
  *G02F 1/1335* (2006.01)

(52) U.S. Cl.
  CPC ............... *G02B 5/223* (2013.01); *G02B 5/26* (2013.01); *G02F 1/133617* (2013.01); *G02F 1/133621* (2013.01); *G03F 7/0007* (2013.01); *G03F 7/0035* (2013.01); *G03F 7/20* (2013.01); *G02F 2001/133614* (2013.01)

(58) Field of Classification Search
  CPC ......... G02F 1/133514; G02F 1/133516; G02F 1/133617; G02F 1/133621
  USPC ............................................. 430/7; 349/106
  See application file for complete search history.

(56) References Cited

U.S. PATENT DOCUMENTS

| | | |
|---|---|---|
| 2010/0208172 A1 | 8/2010 | Jang et al. |
| 2012/0274882 A1 | 11/2012 | Jung |
| 2012/0287381 A1 | 11/2012 | Li et al. |
| 2013/0341588 A1 | 12/2013 | Jeon et al. |

FOREIGN PATENT DOCUMENTS

| | | |
|---|---|---|
| KR | 20160093140 A | 8/2016 |
| WO | WO 2010/010730 A1 * | 1/2010 |

* cited by examiner

METHOD OF MANUFACTURING COLOR CONVERSION SUBSTRATE

This application claims priority to Korean Patent Application No. 10-2015-0124227, filed on Sep. 2, 2015, and all the benefits accruing therefrom under 35 U.S.C. §119, the content of which in its entirety is herein incorporated by reference.

BACKGROUND

1. Field

One or more exemplary embodiments relate to a method of manufacturing a color conversion substrate.

2. Description of the Related Art

As various kinds of electronic apparatuses such as mobile phones, personal digital assistants (PDAs), and large-scale TVs have been developed, the demand for flat panel display devices applicable thereto has gradually increased. A liquid crystal display ("LCD") device is one of the most widely used types of flat panel display device due to low power consumption, easy moving picture display, and high contrast ratio thereof.

The LCD device includes a liquid crystal ("LC") layer between two substrates and displays an image by applying an electric field to the LC layer, changing an arrangement direction of LC molecules, changing the polarization of light incident on the LC molecules, and controlling whether to transmit the incident light to each pixel.

SUMMARY

One or more exemplary embodiments include a method of manufacturing a color conversion substrate.

According to an exemplary embodiment, a method of manufacturing a color conversion substrate includes: preparing a substrate on which a first pixel region, a second pixel region and a third pixel region are defined; providing a first color conversion portion corresponding to the first pixel region on the substrate; providing a second color conversion portion corresponding to the second pixel region on the substrate; and providing a third color conversion portion corresponding to the third pixel region on the substrate. In such an embodiment, the providing the first color conversion portion includes: providing a first color filter of a first color corresponding to the first pixel region; providing a first transparent pattern corresponding to the first pixel region; and providing a first pattern layer corresponding to the first pixel region and including a first material which converts light incident thereto into light of the first color, and the first transparent pattern is provided between the first color filter and the first pattern layer.

In an exemplary embodiment, the first material may include a quantum dot.

In an exemplary embodiment, the first color filter and the first pattern layer may be provided using a same mask.

In an exemplary embodiment, the providing the first pattern layer may include: providing a first photosensitive material layer including the first material on the substrate; exposing a portion of the first photosensitive material layer using a first mask in which an opening is defined; and forming the first pattern layer by removing one of a non-exposed portion and the exposed portion of the first photosensitive material layer.

In an exemplary embodiment, the providing the first color filter may include: providing a first photosensitive pigment layer including a pigment of the first color on the substrate; exposing a portion of the first photosensitive pigment layer using the first mask; and forming the first color filter by removing one of a non-exposed portion and the exposed portion of the first photosensitive pigment layer.

In an exemplary embodiment, the providing the first transparent pattern may include: providing a transparent material layer on the substrate; and patterning the transparent material layer using the first pattern layer corresponding to the first pixel region as a mask.

In an exemplary embodiment, the providing the second color conversion portion may include: providing a second color filter of a second color corresponding to the second pixel region; providing a second transparent pattern corresponding to the second pixel region; and forming a second pattern layer corresponding to the second pixel region and including a second material which converts light incident thereto into light of the second color.

In an exemplary embodiment, the second transparent pattern may be provided between the second color filter and the second pattern layer.

In an exemplary embodiment, the second material may include a quantum dot.

In an exemplary embodiment, the providing the second pattern layer may include: providing a second photosensitive material layer including the second material on the substrate; and exposing a portion of the second photosensitive material layer using a second mask in which an opening is defined, and the providing the second color filter may include: providing a second photosensitive pigment layer including a pigment of the second color on the substrate; and exposing a portion of the second photosensitive pigment layer using the second mask.

In an exemplary embodiment, the portion of the second photosensitive material layer and the portion of the second photosensitive pigment layer may be simultaneously exposed using the second mask.

In an exemplary embodiment, the providing the third color conversion portion may include: providing a third color filter of a third color that corresponds to the third pixel region; providing a third transparent pattern corresponding to the third pixel region; and providing a third pattern layer corresponding to the third pixel region.

In an exemplary embodiment, the third pattern layer may have light transmittance so that light incident thereto is transmitted therethrough.

In an exemplary embodiment, the third pattern layer may include a scatterer.

In an exemplary embodiment, the third pattern layer may include a third material which converts light incident thereto into light of the third color.

In an exemplary embodiment, the method may further include: providing a light-shielding layer between adjacent pixel regions from among the first pixel region, the second pixel region, and the third pixel region.

In an exemplary embodiment, the method may further include: providing a reflective filter on the first color conversion portion.

In an exemplary embodiment, the reflective filter may cover the first pixel region, the second pixel region and the third pixel region.

According to an embodiment of a method of manufacturing a color conversion substrate, a number of masks used to provide a color conversion portion may be substantially reduced or effectively minimized.

BRIEF DESCRIPTION OF THE DRAWINGS

These and/or other features will become apparent and more readily appreciated from the following description of the exemplary embodiments, taken in conjunction with the accompanying drawings, in which.

DETAILED DESCRIPTION

Figure 1:
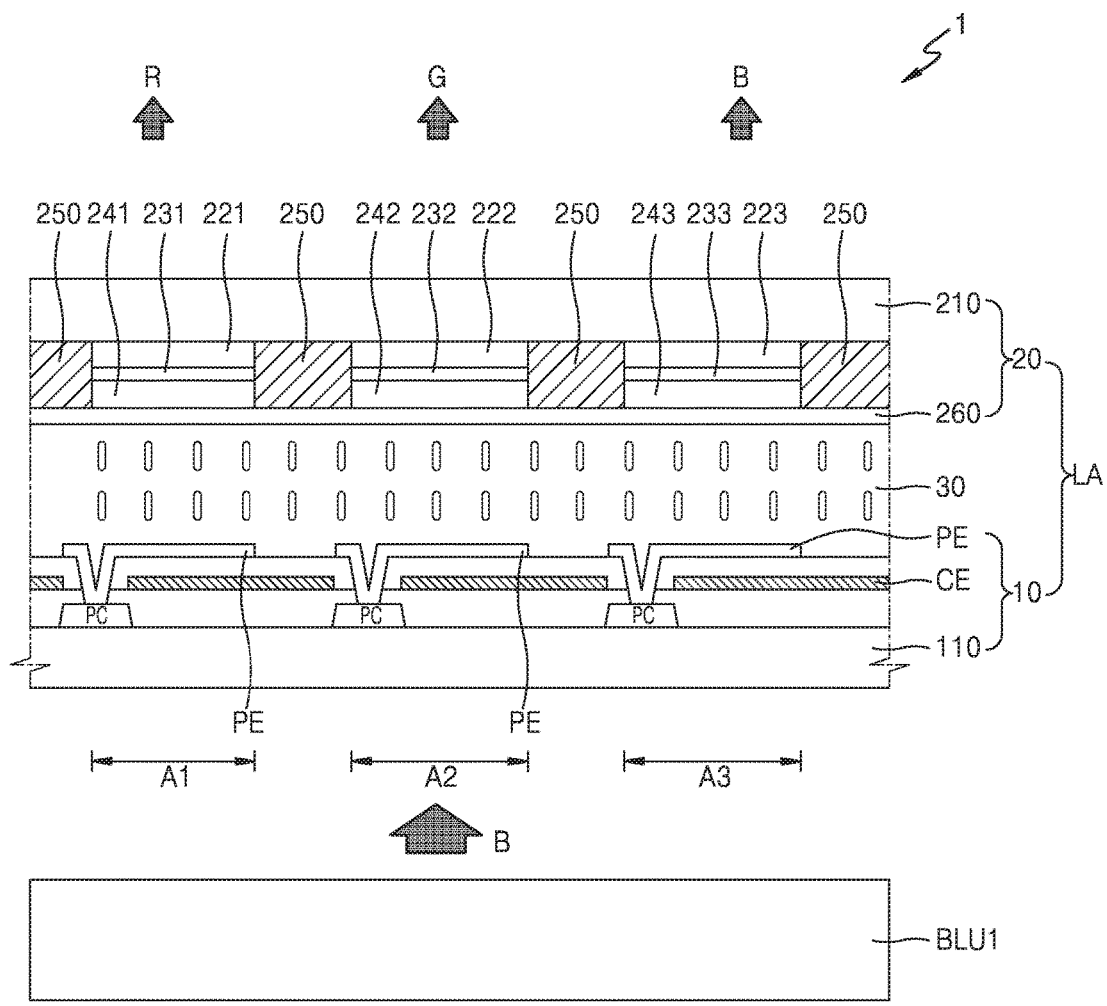
FIG. 1 is a schematic cross-sectional view illustrating a liquid crystal display ("LCD") device according to an exemplary embodiment.

As the inventive concept allows for various changes and numerous embodiments, exemplary embodiments will be illustrated in the drawings and described in detail in the written description. Effects and characteristics of present exemplary embodiments, and a method of accomplishing them will be apparent by referring to content described below in detail together with the drawings. However, the present exemplary embodiments are not limited to exemplary embodiments below and may be implemented in various forms.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof will be omitted.

"Or" means "and/or." As used herein, the term "and/or" includes any and all combinations of one or more of the associated listed items.

It will be understood that although the terms "first", "second", etc. may be used herein to describe various elements, components, regions, layers and/or sections, these elements, components, regions, layers and/or sections should not be limited by these terms. These components are only used to distinguish one element, component, region, layer or section from another element, component, region, layer or section. Thus, "a first element," "component," "region," "layer" or "section" discussed below could be termed a second element, component, region, layer or section without departing from the teachings herein.

As used herein, the singular forms "a," "an" and "the" are intended to include the plural forms as well, unless the context clearly indicates otherwise.

It will be further understood that the terms "comprises" and/or "comprising" or "includes" and/or "including" used herein specify the presence of stated features or components, but do not preclude the presence or addition of one or more other features or components.

It will be understood that when an element is referred to as being "on," another element, it can be directly on the other element or intervening elements may be present therebetween. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments will be described in detail with reference to the accompanying drawings.

FIG. 1 is a schematic cross-sectional view illustrating a liquid crystal display ("LCD") device 1 according to an exemplary embodiment.

Referring to FIG. 1, an exemplary embodiment of the LCD device 1 may include a backlight unit BLU 1 that emits blue light and a display assembly LA that displays an image in response to the blue light. According to an exemplary embodiment, the blue light emitted from the backlight unit BLU 1 may have a peak wavelength in a range from about 420 nanometers (nm) to about 500 nm, for example, a peak wavelength of about 450 nm.

The display assembly LA may include a driving substrate 10, a color conversion substrate 20 disposed to face the driving substrate 10 and a liquid crystal ("LC") layer 30 disposed between the driving substrate 10 and the color conversion substrate 20. The blue light emitted from the backlight unit BLU 1 may be emitted to the outside via the LC layer 30 and the color conversion substrate 20.

The driving substrate 10 may include a first substrate 110, a pixel circuit PC disposed on the first substrate 110, a pixel electrode PE, and a common electrode CE. The pixel circuit PC may include a thin film transistor ("TFT"), which is a switching device connected to a gate line (not shown) and a source line (not shown). The pixel electrode PE may be electrically connected to the pixel circuit PC, and an insulating layer may be disposed between the pixel electrode PE and the pixel circuit PC. The pixel electrode PE may be disposed in each of pixel regions A1, A2, and A3. The pixel electrode PE and the common electrode CE may control the LC layer 30 by generating an electric field. The LC layer 30 may perform a function of a shutter. In one exemplary embodiment, for example, the LC layer 30 may transmit or may not transmit blue light emitted from the backlight unit BLU 1 by using LC molecules having polarization that is changed by the electric field generated by the pixel electrode PE and the common electrode CE.

According to an exemplary embodiment, as shown in FIG. 1, both two electrodes including the common electrode CE and the pixel electrode PE are disposed in the driving substrate 10, but exemplary embodiments are not limited thereto. According to an alternative exemplary embodiment, a number of electrodes and/or arrangement of electrodes may be variously modified depending on an LC mode. In one exemplary embodiment, for example, the pixel electrode PE may be disposed in the driving substrate 10, and the common electrode CE may be disposed in the color conversion substrate 20.

In an exemplary embodiment, as shown in FIG. 1, the color conversion substrate 20 may include a second substrate 210, a color filter layer 220 disposed on the second substrate 210, a transparent layer 230 disposed on the color filter layer 220, a color conversion layer 240 disposed on the transparent layer 230, and a light-shielding layer 250 disposed on the second substrate 210. The light-shielding layer 250 may be disposed between adjacent pixel regions A1, A2, and A3 on the second substrate 210, may effectively prevent color mixing, and increase a contrast by absorbing external light incident to the color conversion substrate 20. In an exemplary embodiment, as shown in FIG. 1, the thickness of the light-shielding layer 250 may be the same as sum of the thicknesses of the transparent layer 230 and the color conversion layer 240, but exemplary embodiments are not limited thereto. In an alternative exemplary embodiment, the thickness of the light-shielding layer 250 may be less than that illustrated in FIG. 1.

The color filter layer 220 may include color filters 221, 222 and 223 corresponding to the pixel regions A1, A2 and A3, respectively. According to an exemplary embodiment, the color filter layer 220 may include a first color filter 221 corresponding to a first pixel region A1, a second color filter 222 corresponding to a second pixel region A2, and a third color filter 223 corresponding to a third pixel region A3. In one exemplary embodiment, for example, the first color filter 221 may include a photosensitive material and red pigment, the second color filter 222 may include a photosensitive material and green pigment, and the third color filter 223 may include a photosensitive material and blue pigment. According to an exemplary embodiment, the photosensitive material may include an acryl-based resin, but exemplary embodiments are not limited thereto.

The transparent layer 230 is disposed between the color filter layer 220 and the color conversion layer 240. According to an exemplary embodiment, the transparent layer 230 may include a first transparent pattern 231 corresponding to the first pixel region A1, a second transparent pattern 232 corresponding to the second pixel region A2, and a third transparent pattern 233 corresponding to the third pixel region A3. The first to third transparent patterns 231, 232 and 233 may include a same material as or different materials from each other. In one exemplary embodiment, for example, the first to third transparent patterns 231, 232, and 233 may include at least one selected from indium tin oxide ("ITO"), indium zinc oxide ("IZO"), zinc oxide (ZnO), indium oxide ($In_2O_3$), indium gallium oxide ("IGO") and aluminum zinc oxide ("AZO"), but exemplary embodiments are not limited thereto.

The color conversion layer 240 may include a plurality of pattern layers 241, 242 and 243 corresponding to the pixel regions A1, A2 and A3, respectively. According to an exemplary embodiment, the color conversion layer 240 may include a first pattern layer 241 corresponding to the first pixel region A1, a second pattern layer 242 corresponding to the second pixel region A2, and a third pattern layer 243 corresponding to the third pixel region A3.

The first pattern layer 241 may include a photosensitive material and a first material that converts light incident thereto into light of a first color. According to an exemplary embodiment, the photosensitive material of the first pattern layer 241 may include an acryl-based resin, but exemplary embodiments are not limited thereto. According to an exemplary embodiment, the first material that converts light incident thereto into light of the first color may include a quantum dot or a fluorescent substance.

The quantum dot or fluorescent substance in the first pattern layer 241 may convert light (for example, blue light) incident to the first pattern layer 241 into red light. According to an exemplary embodiment, the red light may have a peak wavelength in a range from about 620 nm to about 750 nm. In one exemplary embodiment, for example, the quantum dot or fluorescent substance included in the first pattern layer 241 may convert blue light incident to the first pattern layer 241 into red light having a peak wavelength of about 650 nm.

In an exemplary embodiment, where the first pattern layer 241 includes the quantum dot, the quantum dot may include a core structure or a core-shell structure. According to an exemplary embodiment, the quantum dot may include a core including at least one selected from CdS, CdSe, CdTe, ZnS, ZnSe, InAs, ZnSe, ZnO, ZnTe, InP, GaP, InGaN and InN. According to an alternative exemplary embodiment, the quantum dot may include the core and further include a shell surrounding the core. In such an embodiment, the shell may include at least one selected from ZnS, ZnSe, GaP and GaN.

In an exemplary embodiment where the first pattern layer 241 includes a fluorescent substance, the fluorescent substance may be an organic or inorganic fluorescent substance as a red fluorescent substance. According to an exemplary embodiment, the red fluorescent substance may include $(Sr, Ba, Mg, Al)_3SiO_5$:Eu, F.

The second pattern layer 242 may include a photosensitive material and a second material that converts light incident thereto into light of a second color. According to an exemplary embodiment, the photosensitive material of the second pattern layer 242 includes an acryl-based resin, but exemplary embodiments are not limited thereto. According to an exemplary embodiment, the second material that converts light incident thereto into light of the second color may include a quantum dot or a fluorescent substance.

The quantum dot or fluorescent substance in the second pattern layer 242 may convert light (for example, blue light) incident to the second pattern layer 242 into green light. According to an exemplary embodiment, the green light may have a peak wavelength in a range from about 490 nm to about 570 nm. In one exemplary embodiment, for example, the quantum dot in the second pattern layer 242 may convert light incident thereto into green light having a peak wavelength of about 550 nm.

In the case where the second pattern layer 242 includes the quantum dot, the quantum dot may include a core structure or a core-shell structure. According to an exemplary embodiment, the quantum dot may include a core including at least one selected from CdS, CdSe, CdTe, ZnS, ZnSe, InAs, ZnSe, ZnO, ZnTe, InP, GaP, InGaN and InN. According to an alternative exemplary embodiment, the quantum dot may include the core and further include a shell surrounding the core. In such an embodiment, the shell may include at least one selected from ZnS, ZnSe, GaP and GaN. Since the quantum dot may emit light of a relatively short wavelength when the size of the quantum dot is small, the size of the quantum dot in the second pattern layer 242 may be less than the size of the quantum dot included in the first pattern layer 241.

In an exemplary embodiment where the second pattern layer 242 includes a fluorescent substance, the fluorescent substance of the second pattern layer 242 may be an organic or inorganic fluorescent substance as a green fluorescent substance. According to an exemplary embodiment, the green fluorescent substance may include $(Sr, Ba, Mg)_2SiO_4$: Eu, F.

The red light and green light converted by the quantum dot (or fluorescent substance) of the first pattern layer 241 and the second pattern layer 242 are emitted toward or along various directions. A reflective filter 260 may be further disposed on the color conversion layer 240 to allow light toward the driving substrate 10 from among the red light and green light converted by the quantum dot (or fluorescent substance) to progress toward the second substrate 210. The reflective filter 260 is disposed on a surface or one side of the color conversion layer 240 that faces the driving substrate 10, transmits blue light, and selectively reflects red light and green light. According to an exemplary embodiment, the reflective film 260 may include a plurality of inorganic layers in which a layer of SiOx and/or a layer of SiNx are disposed one on another.

The third pattern layer 243 includes a transmissive material that transmits light incident thereto without conversion. In one exemplary embodiment, for example, the third pattern layer 243 may include a photosensitive material that transmits blue light. According to an exemplary embodiment, the third pattern layer 243 may include a photosensitive material including an acryl-based resin. Blue light emitted from the backlight unit BLU 1 may pass through the LC layer 30 functioning as a shutter, and then may be emitted to the outside through the third pattern layer 243. According to an exemplary embodiment, the third pattern layer 243 may include a scatterer such as $TiO_2$, and the blue light that passes through the third pattern layer 243 may progress in various directions via the scatterer.

The blue light emitted from the backlight unit BLU 1 is incident to the pixel regions A1, A2 and A3. The blue light incident to the pixel regions A1, A2 and A3 may progress toward the color conversion substrate 20 or may be blocked depending on an on/off operation of the LC layer 30. According to an exemplary embodiment, the blue light passed through the LC layer 30 is converted to red light by the quantum dot (or fluorescent substance) of the first pattern layer 241 in the first pixel region A1, and the converted red light passes through the first transparent pattern 231 and the first color filter 221, and is emitted to the outside. The blue light passed through the LC layer 30 is converted to green light by the quantum dot (or fluorescent substance) of the second pattern layer 242 on the second pixel region A2, and the converted green light passes through the second transparent pattern 232 and the second color filter 222, and is emitted to the outside. The blue light passed through the LC layer 30 passes through the transmissive third pattern layer 243, the third transparent pattern 233 and the third color filter 223 in the third pixel region A3 and is emitted to the outside.

The first to third pattern layers 241, 242, and 243 of the color conversion layer 240 converts incident light into light of a predetermined color or transmits the incident light, and the light passed through the color conversion layer 240 passes through the transparent layer 230 and progresses to the color filter layer 220. The first to third color filters 221, 222, and 223 of the color filter layer 220 may have the same color as that of the light having the predetermined color converted or transmitted by the color conversion layer 240. In one exemplary embodiment, for example, the color of the first color filter 221 is the same as the color (for example, a red color) of light converted by the first pattern layer 241, the color of the second color filter 222 is the same as the color (for example, a green color) of light converted by the second pattern layer 242, and the color of the third color filter 223 is the same as the color (for example, a blue color) of light passed through the third pattern layer 243.

Herein, "color is the same" means a peak wavelength is in a wavelength band of the same color. In one exemplary embodiment, for example, where the color of the first color filter 221 is the same as that of the light converted by the first pattern layer 241, that a peak wavelength of light passed through the first color filter 221 and the color of light converted by the first pattern layer 241 are in a red wavelength band (for example, a band ranging from about 620 to about 750 nm). In such an embodiment, the peak wavelength of light passed through the first color filter 221 and a peak wavelength of the light converted by the first pattern layer 241 are in the red wavelength band and may not have the same value. In an exemplary embodiment, where the color of the second color filter 222 is the same as that of the light converted by the second pattern layer 242, a peak wavelength of light passed through the second color filter 222 and the color of light converted by the second pattern layer 242 is in a green wavelength band (for example, a band ranging from about 490 to about 570 nm). In such an embodiment, the peak wavelength of light passed through the second color filter 222 and a peak wavelength of the light converted by the second pattern layer 242 are in the green wavelength band and may not have the same value. In an exemplary embodiment, where the color of the third color filter 223 is the same as that of the light passed through the third pattern layer 243, a peak wavelength of light passed through the third color filter 223 and the color of the light passed through the third pattern layer 243 are in a blue wavelength band (for example, a band ranging from about 420 to about 500 nm). In such an embodiment, the peak wavelength of light passed through the third color filter 223 and a peak wavelength of the light passed through the third pattern layer 243 are in the blue wavelength band and may not have the same value.

The color filter layer 220 may improve color purity of the pixel regions A1, A2 and A3. The blue light emitted from the backlight unit BLU 1 may be converted into or transmitted as red light or green light by the first and second pattern layers 241 and 242 of the color conversion layer 240. In an exemplary embodiment, the quantum dots (or fluorescent substances) of the first and second pattern layers 241 and 242 corresponding to the red and green pixel regions A1 and A2 convert the blue light into the red light or the green light and emit the same as described above. However, in an exemplary embodiment where a portion of the blue light been incident to the first and second pattern layers 241 and 242 but has not been converted by the quantum dot (or fluorescent substance) is emitted to the outside, color purity may deteriorate. However, according to an exemplary embodiment, the color filter layer 220 is disposed between the second substrate 210 and the color conversion layer 240, such that a portion of the blue light not converted by the quantum dot (or fluorescent substance) may be effectively prevented from being viewed to the outside.

The color filter layer 220 may block light incident to the color conversion layer 240 from the outside. In an exemplary embodiment where external light is incident to the color conversion layer 240 via the color conversion substrate 20, the quantum dot (or fluorescent substance) included in the color conversion layer 240 may be undesired excited by the external light and light may be emitted. However, according to an exemplary embodiment, since the color filter layer 220 is disposed between the color conversion layer 240 and the second substrate 210, external light passed through the second substrate 210 and is incident to the color conversion layer 240 may be absorbed by the color filter layer 220, such that undesired excitation of the quantum dot (or fluorescent substance) may be effectively prevented.

Hereinafter, a method of manufacturing a color conversion filter according to an exemplary embodiment will be described in detail with reference to FIGS. 2 to 13.

FIGS. 2 to 13 are schematic cross-sectional views illustrating a method of manufacturing a color conversion substrate according to an exemplary embodiment.

Figure 2:
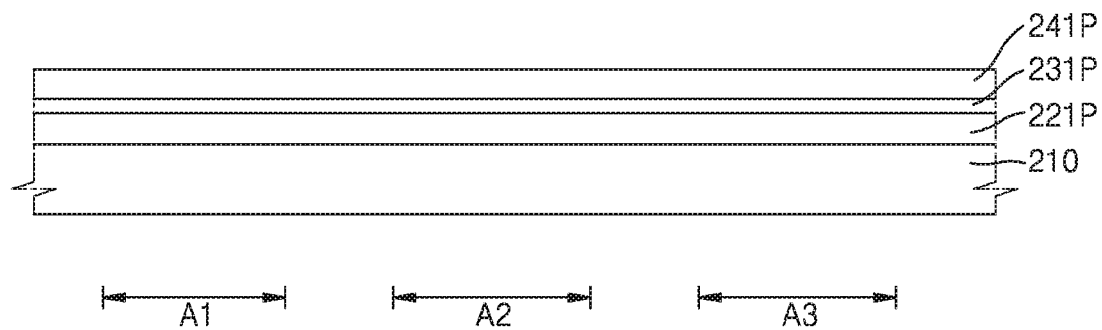
FIGS. 2 to 13 are schematic cross-sectional views illustrating a method of manufacturing a color conversion substrate, according to an exemplary embodiment.

Referring to FIG. 2, in an exemplary embodiment, a first photosensitive pigment layer 221$p$ including pigment of a first color, a first transparent layer 231$p$, and a first photosensitive material layer 241$p$ including a quantum dot (or fluorescent substance) are sequentially provided, e.g., formed, on the second substrate 210. The first photosensitive pigment layer 221$p$, the first transparent layer 231$p$ and the first photosensitive material layer 241$p$ may be provided over an entire surface of the second substrate 210.

The first photosensitive pigment layer 221$p$ may include a photosensitive material and pigment of the first color (for example, a red color). According to an exemplary embodiment, the photosensitive material of the first photosensitive pigment layer 221$p$ may include an acryl-based resin, but exemplary embodiments are not limited thereto.

The first transparent layer 231$p$ may include at least one selected from ITO, IZO, ZnO, $In_2O_3$, IGO and AZO, but exemplary embodiments are not limited thereto. The first transparent layer 231$p$ may be provided between the first photosensitive pigment layer 221$p$ and the first photosensitive material layer 241$p$ and thereby prevent mixing of such layers.

The first photosensitive material layer 241$p$ may include a photosensitive material and a quantum dot or a fluorescent substance that converts incident light into light of the first color. According to an exemplary embodiment, the photosensitive material of the first photosensitive material layer 241$p$ may include an acryl-based resin, but exemplary embodiments are not limited thereto.

According to an exemplary embodiment, the quantum dot may include a core including at least one selected from CdS, CdSe, CdTe, ZnS, ZnSe, InAs, ZnSe, ZnO, ZnTe, InP, GaP, InGaN, and InN. According to an alternative exemplary embodiment, the quantum dot may include the core and further include a shell surrounding the core. In such an embodiment, the shell may include at least one selected from ZnS, ZnSe, GaP, and GaN.

According to an exemplary embodiment, the fluorescent substance may be an organic or inorganic fluorescent substance as a red fluorescent substance. According to an exemplary embodiment, the red fluorescent substance may include $(Sr, Ba, Mg, Al)_3SiO_5:Eu, F$.

Figure 3:
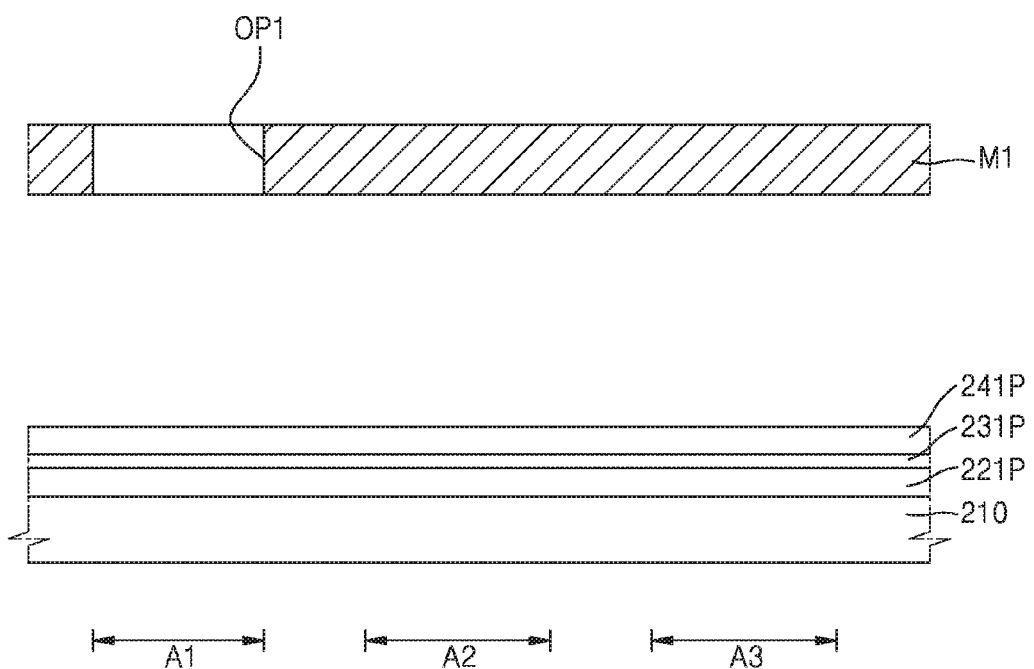

Referring to FIG. 3, the first photosensitive pigment layer 221$p$ and the first photosensitive material layer 241$p$ are exposed using a first mask M1 in which a first opening OP1 corresponding to the first pixel region A1 is defined.

A portion of the first photosensitive material layer 241$p$ that corresponds to the first pixel region A1 is exposed by light irradiated via the first opening OP1. Since the first transparent layer 231$p$ is disposed between the first photosensitive material layer 241$p$ and the first photosensitive pigment layer 221$p$, the light irradiated via the first opening OP1 passes through the first photosensitive material layer 241$p$ and the first transparent layer 231$p$ and reaches the first photosensitive pigment layer 221$p$. In such an embodiment, the first photosensitive material layer 241$p$ and the first photosensitive pigment layer 221$p$ are simultaneously exposed using the first mask M1.

Figure 4:
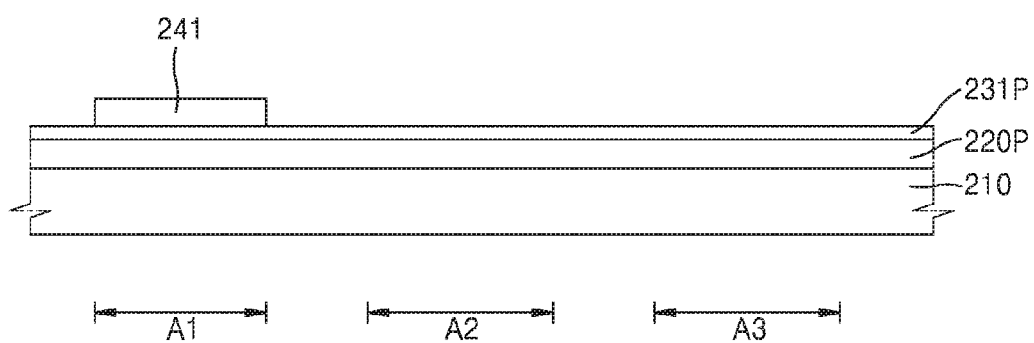

Referring to FIG. 4, the first pattern layer 241 is formed by removing a non-exposed portion of the first photosensitive material layer 241$p$. In one exemplary embodiment, for example, the non-exposed portion of the first photosensitive material layer 241$p$ may be removed using a developer.

Figure 5:
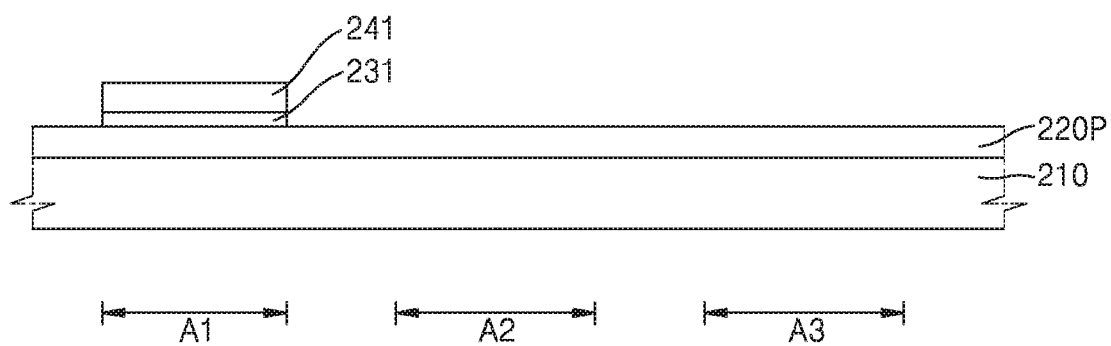

Referring to FIG. 5, the first transparent pattern 231 may be formed by patterning the first transparent layer 231$p$ using the first pattern layer 241 as a mask. According to an exemplary embodiment, a portion of the first pattern layer 241 that corresponds to the first pixel region A1 is baked and thus a corresponding surface of the first pattern layer 241 is hardened, and the first transparent pattern 231 corresponding to the first pixel region A1 may be formed by etching the first transparent layer 231$p$ by using the hardened first pattern layer 241 as a mask.

Figure 6:
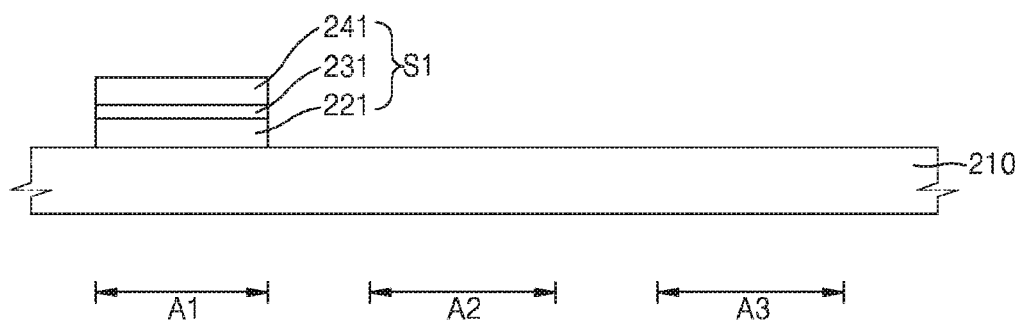

Referring to FIG. 6, the first color filter layer 221 is formed by removing a non-exposed portion of the first photosensitive pigment layer 221$p$. In one exemplary embodiment, for example, the non-exposed portion of the first photosensitive pigment layer 221$p$ may be removed using a developer.

In an exemplary embodiment, the photosensitive material in the first photosensitive material layer 241$p$ and the first photosensitive pigment layer 221$p$ may be a negative type photosensitive material as described above with reference to FIGS. 3, 4 and 6, but exemplary embodiments are not limited thereto. According to an alternative exemplary embodiment, the photosensitive material in the first photosensitive material layer 241$p$ and the first photosensitive pigment layer 221$p$ may be a positive type photosensitive material. In such an embodiment, the first opening OP1 in the first mask M1 corresponds to the rest of the pixel regions that excludes the first pixel region A1, and portions of the first photosensitive material layer 241$p$ and the first photosensitive pigment layer 221$p$ that are exposed by the first opening OP1 are removed, so that the first pattern layer 241 and the first color filter 221 may be formed.

For convenience of description, the first pattern layer 241, the first transparent pattern 231 and the first color filter 221 that correspond to the first pixel region A1 formed as described above with reference to FIGS. 2 to 6 are referred to as a first color conversion portion S1.

Figure 7:
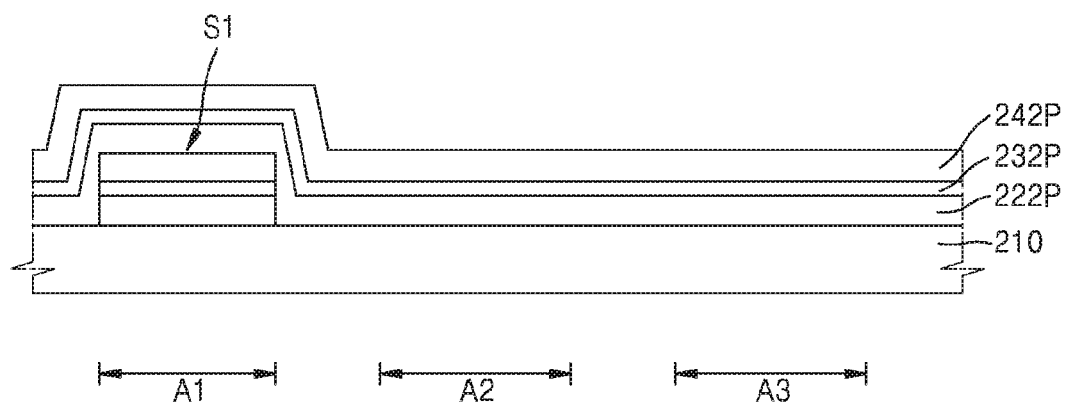

Referring to FIG. 7, a second photosensitive pigment layer 222p including pigment of the second color, a second transparent layer 232p, and a second photosensitive material layer 242p including a quantum dot (or fluorescent substance) are sequentially provided, e.g., formed, on the second substrate 210 including the first color conversion portion S1 provided thereon. The second photosensitive pigment layer 222p, the second transparent layer 232p and the second photosensitive material layer 242p may be provided over the entire surface of the second substrate 210.

The second photosensitive pigment layer 222p may include a photosensitive material and pigment of the second color, for example, a green color. According to an exemplary embodiment, the photosensitive material of the second photosensitive pigment layer 222p may include an acryl-based resin, but exemplary embodiments are not limited thereto.

The second transparent layer 232p may include at least one selected from ITO, IZO, ZnO, $In_2O_3$, IGO, and AZO, but exemplary embodiments are not limited thereto. The second transparent layer 232p may be disposed between the second photosensitive pigment layer 222p and the second photosensitive material layer 242p and thereby prevent mixing of such layers.

The second photosensitive material layer 242p may include a photosensitive material and a quantum dot or a fluorescent substance that converts incident light into light of the second color. According to an exemplary embodiment, the photosensitive material of the second photosensitive material layer 242p may include an acryl-based resin, but exemplary embodiments are not limited thereto.

According to an exemplary embodiment, the quantum dot may include a core including at least one selected from CdS, CdSe, CdTe, ZnS, ZnSe, InAs, ZnSe, ZnO, ZnTe, InP, GaP, InGaN and InN. According to an alternative exemplary embodiment, the quantum dot may include the core and further include a shell surrounding the core. In such an embodiment, the shell may include at least one selected from ZnS, ZnSe, GaP and GaN. According to an exemplary embodiment, the size of the quantum dot in the second photosensitive material layer 242p may be less than the size of the quantum dot in the first photosensitive material layer 241p.

The fluorescent substance may be an organic or inorganic fluorescent substance as a green fluorescent substance. According to an exemplary embodiment, the green fluorescent substance may include $(Sr, Ba, Mg)_2SiO_4$:Eu, F.

Figure 8:
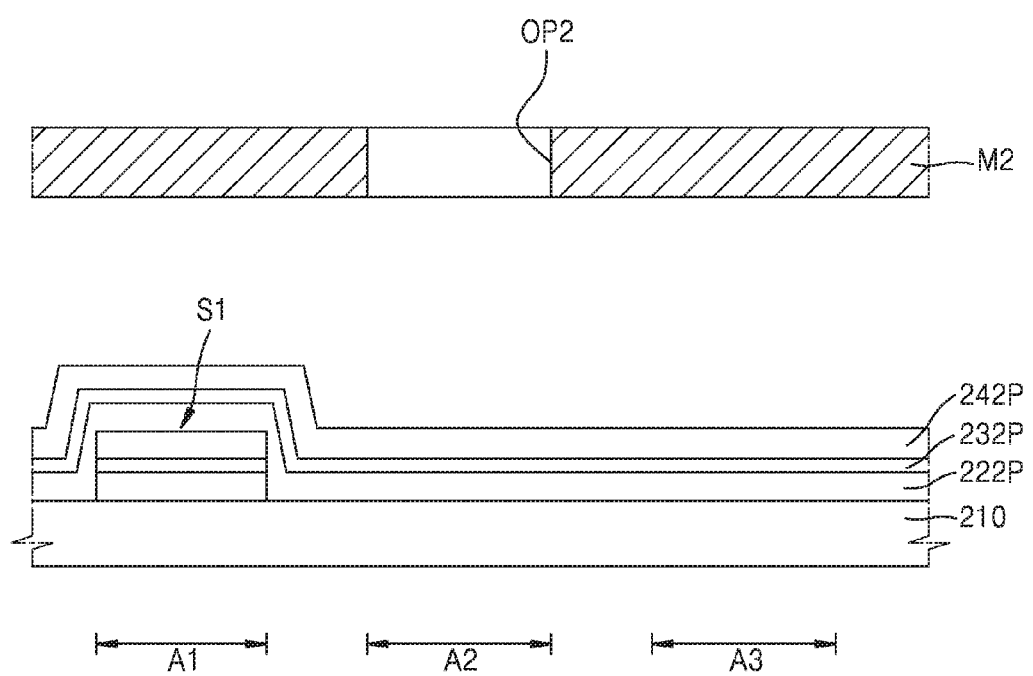

Referring to FIG. 8, the second photosensitive pigment layer 222p and the second photosensitive material layer 242p are exposed using a second mask in which a second opening OP2 corresponding to the second pixel region A2 is defined.

A portion of the second photosensitive material layer 242p that corresponds to the second pixel region A2 is exposed by light irradiated via the second opening OP2. Since the second transparent layer 232p is disposed between the second photosensitive material layer 242p and the second photosensitive pigment layer 222p, the light irradiated via the second opening OP2 passes through the second photosensitive material layer 242p and the second transparent layer 232p and reaches the second photosensitive pigment layer 222p. In such an embodiment, the second photosensitive material layer 242p and the second photosensitive pigment layer 222p are simultaneously exposed using the second mask M2.

Figure 9:
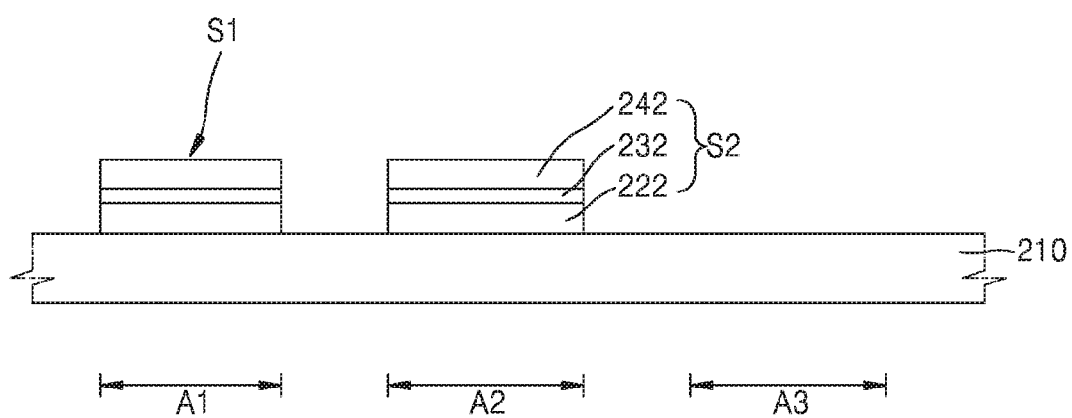

Referring to FIG. 9, the second pattern layer 242 is formed by removing a non-exposed portion of the second photosensitive material layer 242p, the second transparent pattern 232 is formed by patterning the second transparent layer 232p using the second pattern layer 242 as a mask, and the second color filter 222 is formed by removing a non-exposed portion of the second photosensitive pigment layer 222p.

According to an exemplary embodiment, the second pattern layer 242 corresponding to the second pixel region A2 may be formed by removing the non-exposed portion of the second photosensitive material layer 242p using a developer. After the second pattern layer 242 is baked and thus the surface of the second pattern layer 242 is hardened, the second transparent pattern 232 may be formed by etching the second transparent layer 232p using the second pattern layer 242 as a mask. After that, the second color filter 222 is formed by removing the non-exposed portion of the second photosensitive pigment layer 222p.

In an exemplary embodiment, the photosensitive material in the second photosensitive material layer 242p and the second photosensitive pigment layer 222p may be a negative type photosensitive material as described above with reference to FIGS. 8 and 9, but exemplary embodiments are not limited thereto. According to an alternative exemplary embodiment, the photosensitive material in the second photosensitive material layer 242p and the second photosensitive pigment layer 222p may be a positive type photosensitive material. In such an embodiment, the second opening OP2 in the second mask M2 corresponds to the rest of the pixel regions that excludes the second pixel region A2, and portions of the second photosensitive material layer 242p and the second photosensitive pigment layer 222p that are exposed by the second opening OP2 are removed, so that the second pattern layer 242 and the second color filter 222 may be formed.

For convenience of description, the second pattern layer 242, the second transparent pattern 232 and the second color filter 222 that correspond to the second pixel region A2 formed as described above with reference to FIGS. 7 to 9 are referred to as a second color conversion portion S2.

Figure 10:
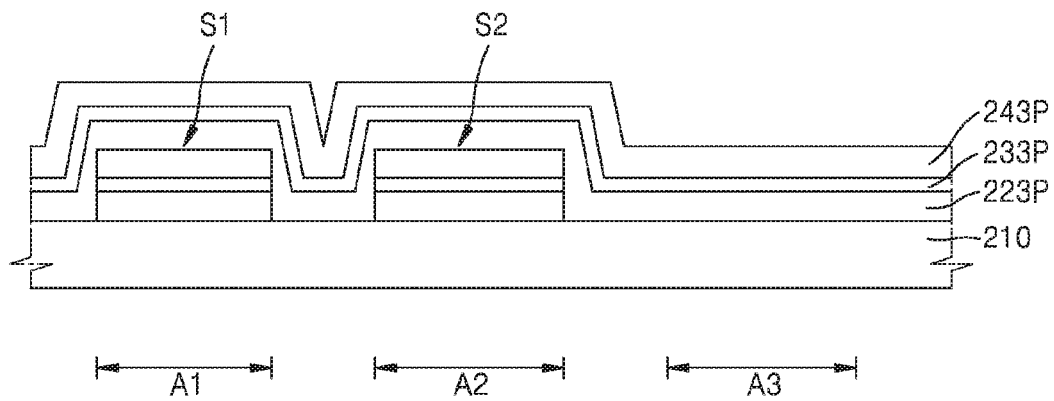

Referring to FIG. 10, a third photosensitive pigment layer 223p including pigment of the third color, a third transparent layer 233p, and a third photosensitive material layer 243p including a photosensitive material are sequentially provided, e.g., formed, on the second substrate 210 including the first color conversion portion S1 and the second color conversion portion S2. The third photosensitive pigment layer 223p, the third transparent layer 233p and the third photosensitive material layer 243p may be formed over the entire surface of the second substrate 210.

The third photosensitive pigment layer 223p may include a photosensitive material and pigment of the third color, for example, a blue color. According to an exemplary embodiment, the photosensitive material of the third photosensitive pigment layer 223p may include an acryl-based resin, but exemplary embodiments are not limited thereto.

The third transparent layer 233p may include at least one selected from ITO, IZO, ZnO, $In_2O_3$, IGO and AZO, but exemplary embodiments are not limited thereto. The third transparent layer 233p may be disposed between the third photosensitive pigment layer 223p and the third photosensitive material layer 243p and prevent mixing of these layers.

The third photosensitive material layer 243p may include, for example, a material having light transmittance and photosensitivity such as an acryl-based resin. According to an exemplary embodiment, the third photosensitive material layer 243p may include not only the material having light transmittance and photosensitivity but also a scatterer such as TiO$_2$.

Figure 11:
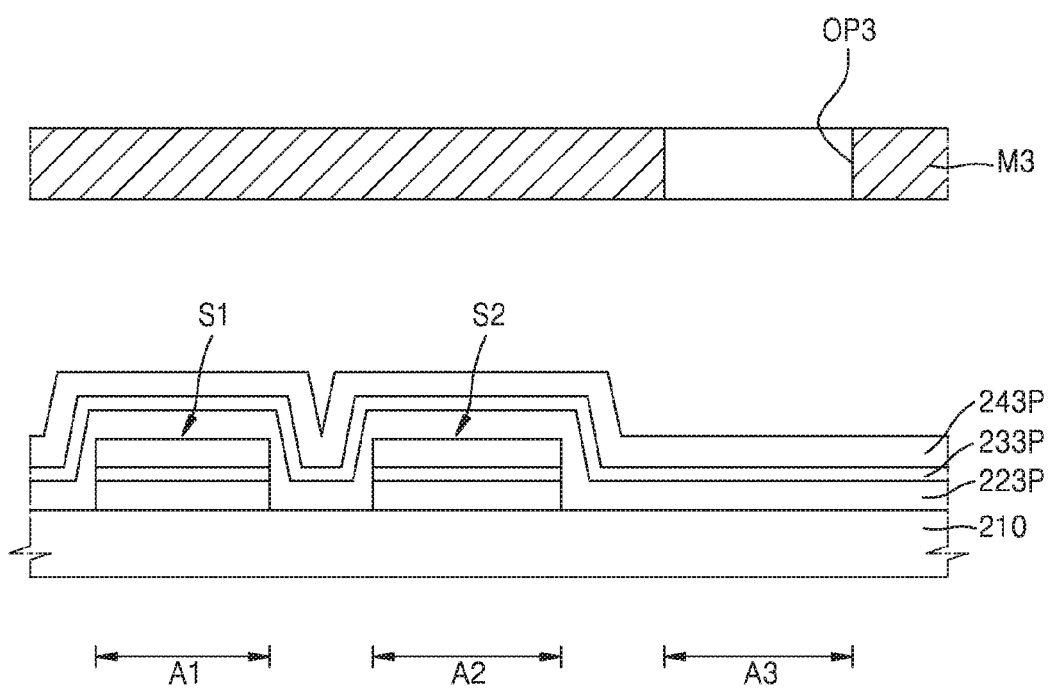

Referring to FIG. 11, the third photosensitive pigment layer 223p and the third photosensitive material layer 243p are exposed using a third mask M3 in which a third opening OP3 corresponding to the third pixel region A3 is defined.

A portion of the third photosensitive material layer 243p that corresponds to the third pixel region A3 is exposed by light irradiated via the third opening OP3. Since the third transparent layer 233p is disposed between the third photosensitive material layer 243p and the third photosensitive pigment layer 223p, the light irradiated via the third opening OP3 passes through the third photosensitive material layer 243p and the third transparent layer 233p and reaches the third photosensitive pigment layer 223p. In such an embodiment, the third photosensitive material layer 243p and the third photosensitive pigment layer 223p are simultaneously exposed using the third mask M3.

Figure 12:
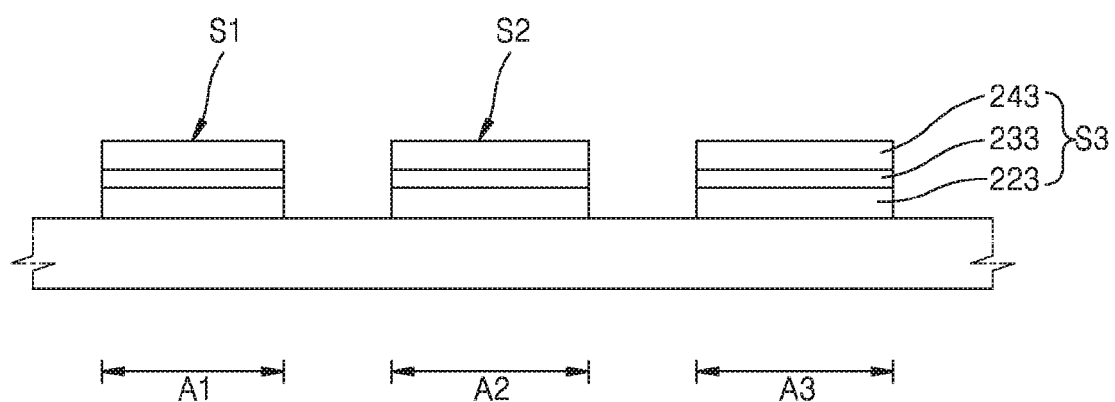

Referring to FIG. 12, the third pattern layer 243 is formed by removing a non-exposed portion of the third photosensitive material layer 243p, the third transparent pattern 233 is formed by patterning the third transparent layer 233p using the third pattern layer 243 as a mask, and the third color filter 223 is formed by removing a non-exposed portion of the third photosensitive pigment layer 223p.

According to an exemplary embodiment, the third pattern layer 243 corresponding to the third pixel region A3 may be formed by removing the non-exposed portion of the third photosensitive material layer 243p using a developer. After the third pattern layer 243 is baked and thus the surface of the third pattern layer 243 is hardened, the third transparent pattern 233 may be formed by etching the third transparent layer 233p using the third pattern layer 243 as a mask. After that, the third color filter 223 is formed by removing the non-exposed portion of the third photosensitive pigment layer 223p.

In an exemplary embodiment, the photosensitive material in the third photosensitive material layer 243p and the third photosensitive pigment layer 223p may be a negative type photosensitive material as described above with reference to FIGS. 11 and 12, but exemplary embodiments are not limited thereto. According to an alternative exemplary embodiment, the photosensitive material in the third photosensitive material layer 243p and the third photosensitive pigment layer 223p may be a positive type photosensitive material. In such an embodiment, the third opening OP3 in the third mask M3 corresponds to the rest of the pixel regions that excludes the third pixel region A3, and portions of the third photosensitive material layer 243p and the third photosensitive pigment layer 223p that are exposed by the third opening OP3 are removed, so that the third pattern layer 243 and the third color filter 223 may be formed.

For convenience of description, the third pattern layer 243, the third transparent pattern 233, and the third color filter 223 that correspond to the third pixel region A3 formed as described above with reference to FIGS. 10 to 12 are referred to as a third color conversion portion S3.

Figure 13:
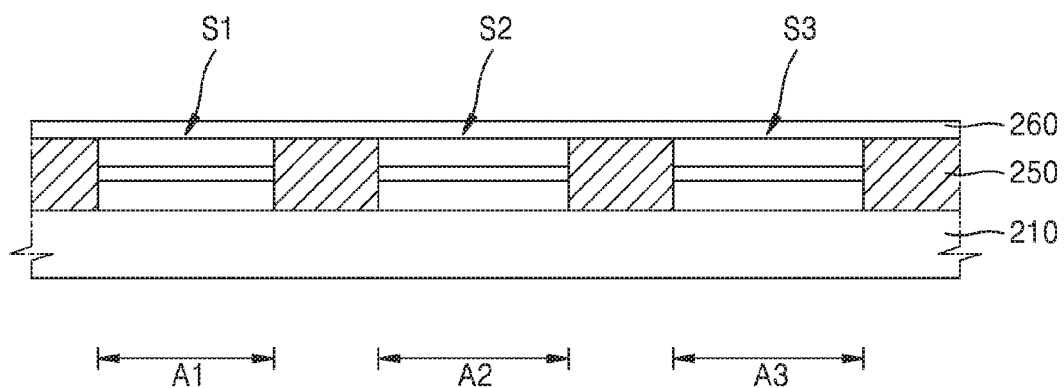

Referring to FIG. 13, the light-shielding portion 250 is formed between the first to third pixel regions A1, A2 and A3 of the second substrate 210. According to an exemplary embodiment, the light-shielding portion 250 may include metal or an organic insulating material. According to an exemplary embodiment, where the light-shielding portion 250 includes opaque metal such as chrome, the chrome may be deposited on the second substrate 210, and then patterned by a photolithography/etching process. According to an alternative exemplary embodiment, where the light-shielding portion 250 includes an organic insulating material such as carbon black, the light-shielding portion 250 may be patterned by exposing and developing processes.

After that, the reflective filter 260 is provided, e.g., formed, on the first to third color conversion portions S1, S2, and S3. According to an exemplary embodiment, the reflective filter 260 may include a plurality of layers in which a layer of SiOx and/or a layer of SiNx are disposed one on another. The reflective filter 260 may be integrally formed over the first to third pixel regions A1, A2, and A3.

In an exemplary embodiment, as described above, the light-shielding portion 250 is provided after the first to third color conversion portions S1, S2 and S3 are formed, but exemplary embodiments are not limited thereto. According to an alternative exemplary embodiment, the first to third color conversion portions S1, S2, and S3 may be provided after providing the light-shielding portion 250.

According to an exemplary embodiment, as described above with reference to FIGS. 2 to 13, since the pattern layers 241, 242 and 243, and the color filters 221, 222 and 223 of the first to third color conversion portions S1, S2 and S3 are provided using the same mask, a number of masks for providing the first to third color conversion portions S1, S2 and S3 may be minimized to three.

Figure 14:
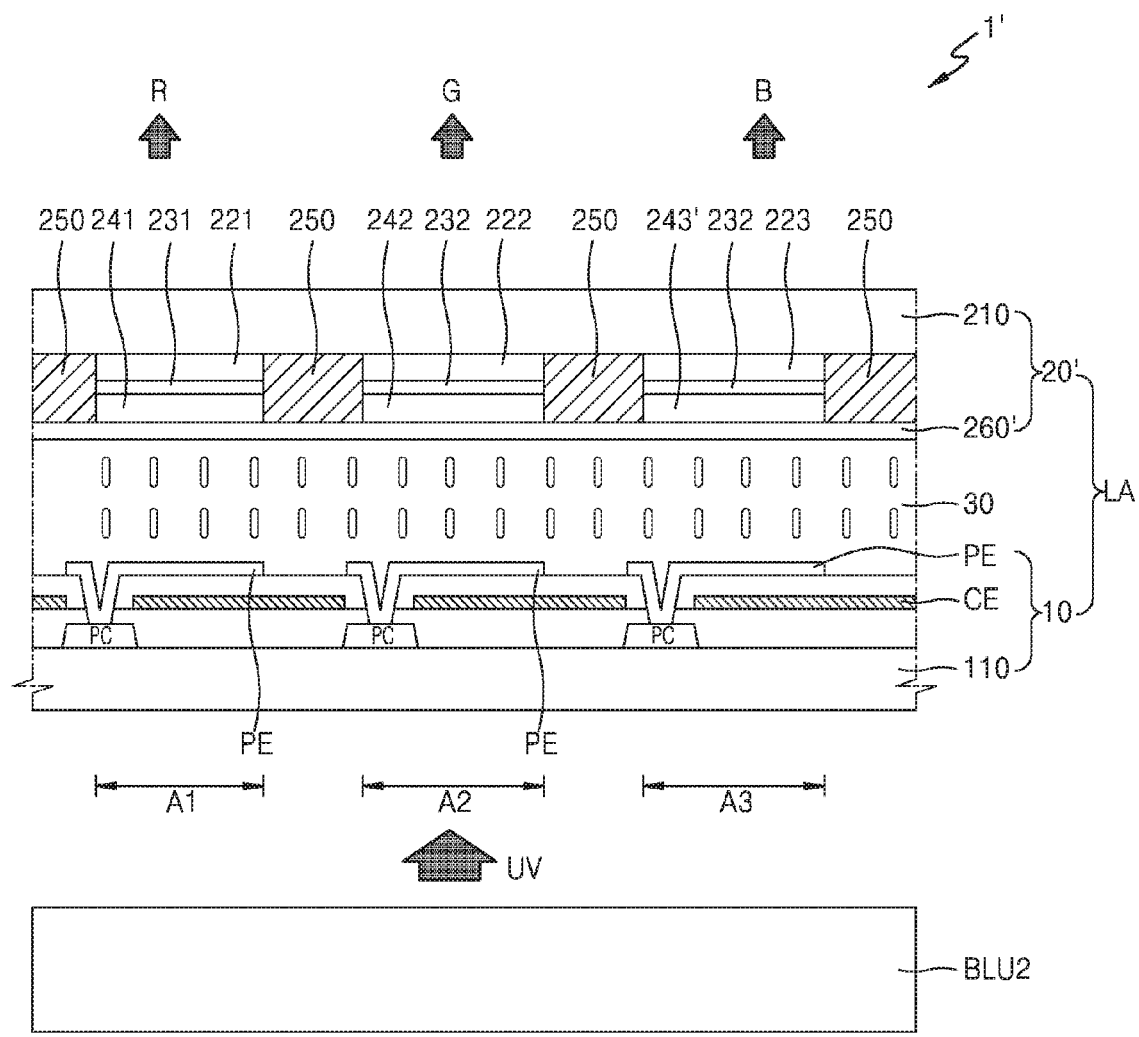
FIG. 14 is a schematic cross-sectional view illustrating an LCD device according to an alternative exemplary embodiment.

FIG. 14 is a schematic cross-sectional view illustrating an LCD device 1' according to an alternative exemplary embodiment.

Referring to FIG. 14, an exemplary embodiment of the LCD device 1' includes a backlight unit BLU 2 that emits ultraviolet ("UV") light, and a display assembly LA that displays an image using the UV light. The backlight unit BLU 2 may emit the UV light having a peak wavelength, for example, in a range from about 10 nm to about 390 nm.

The display assembly LA may include the driving substrate 10, a color conversion substrate 20' disposed opposite to the driving substrate 10, and the liquid crystal (LC) layer 30 disposed between the driving substrate 10 and the color conversion substrate 20'. The UV light emitted from the backlight unit BLU 2 may be emitted to the outside via the LC layer 30 and the color conversion substrate 20'. Since specific configuration of the driving substrate 10 is the same as the configuration described with reference to FIG. 1, description thereof is omitted.

The color conversion substrate 20' may include the second substrate 210, the color filter layer 220 disposed on the second substrate 210, the transparent layer 230 disposed on the color filter layer 220, the color conversion layer 240 disposed on the transparent layer 230, and the light-shielding layer 250. The light-shielding portion 250 and the color filter layer 220 of such an embodiment are the same as those described above with reference to FIG. 1, and any repetitive detailed description thereof will hereinafter be omitted.

The color conversion layer 240 may include a plurality of pattern layers 241, 242 and 243' corresponding to the pixel regions A1, A2 and A3, respectively. The color conversion layer 240 may include the first pattern layer 241 corresponding to the first pixel region A1, the second pattern layer 242 corresponding to the second pixel region A2, and the third pattern layer 243' corresponding to the third pixel region A3.

The first pattern layer 241 may include a photosensitive material and a first material that converts light incident to the first pattern layer 241 into light of the first color. According to an exemplary embodiment, the photosensitive material of the first pattern layer 241 may include an acryl-based resin, but exemplary embodiments are not limited thereto. According to an exemplary embodiment, the first material that converts incident light into light of the first color may be a quantum dot or a fluorescent substance.

The quantum dot or fluorescent substance in the first pattern layer 241 may convert light (for example, UV light) incident to the first pattern layer 241 into red light. According to an exemplary embodiment, the red light may have a peak wavelength in a range from about 620 nm to about 750 nm. In one exemplary embodiment, for example, the quantum dot or fluorescent substance included in the first pattern layer 241 may convert incident light into red light having a peak wavelength of about 650 nm.

In an exemplary embodiment where the first pattern layer 241 includes the quantum dot, the quantum dot may include a core structure or a core-shell structure. According to an exemplary embodiment, the quantum dot may include a core including at least one selected from CdS, CdSe, CdTe, ZnS, ZnSe, InAs, ZnSe, ZnO, ZnTe, InP, GaP, InGaN and InN. According to an alternative exemplary embodiment, the quantum dot may include the core and further include a shell surrounding the core. In such an embodiment, the shell may include at least one selected from ZnS, ZnSe, GaP and GaN.

In an exemplary embodiment where the first pattern layer 241 includes a fluorescent substance, the fluorescent substance may be a red fluorescent substance. In such an embodiment, the red fluorescent substance may include $(Sr, Ba, Mg, Al)_3SiO_5$:Eu, F or $YVO_4$:Eu, etc.

The second pattern layer 242 may include a photosensitive material and a second material that converts light incident to the second pattern layer 242 into light of the second color. According to an exemplary embodiment, the photosensitive material of the second pattern layer 242 may include an acryl-based resin, but exemplary embodiments are not limited thereto. According to an exemplary embodiment, the second material that converts incident light into light of the second color may be a quantum dot or a fluorescent substance.

The quantum dot or fluorescent substance included in the second pattern layer 242 may convert light (for example, UV light) incident to the second pattern layer 242 into green light. According to an exemplary embodiment, the green light may have a peak wavelength in a range ranging from about 500 to about 570 nm. In one exemplary embodiment, for example, the quantum dot or fluorescent substance included in the second pattern layer 242 may convert incident light into green light having a peak wavelength of about 550 nm.

In an exemplary embodiment, where the second pattern layer 242 includes the quantum dot, the quantum dot may include a core structure or a core-shell structure. According to an exemplary embodiment, the quantum dot may include a core including at least one selected from CdS, CdSe, CdTe, ZnS, ZnSe, InAs, ZnSe, ZnO, ZnTe, InP, GaP, InGaN and InN. According to an alternative exemplary embodiment, the quantum dot may include the core and further include a shell surrounding the core. In such an embodiment, the shell may include at least one selected from ZnS, ZnSe, GaP and GaN.

In an exemplary embodiment where the second pattern layer 242 includes the fluorescent substance, the fluorescent substance may be a green fluorescent substance. In such an embodiment, the green fluorescent substance may include $(Sr, Ba, Mg)_2SiO_4$:Eu, F or $(Ba, Eu)(Mg, Mn)Al_{10}O_{17}$.

The third pattern layer 243' may include a photosensitive material and a third material that converts light incident to the third pattern layer 243' into light of the third color. According to an exemplary embodiment, the photosensitive material of the third pattern layer 243' may include an acryl-based resin, but exemplary embodiments are not limited thereto. According to an exemplary embodiment, the third material that converts incident light into light of the third color may be a quantum dot or a fluorescent substance.

The quantum dot or fluorescent substance included in the third pattern layer 243' may convert light (for example, UV light) incident to the third pattern layer 243' into blue light. According to an exemplary embodiment, the blue light may have a peak wavelength in a range ranging from about 400 to about 500 nm. In one exemplary embodiment, for example, the quantum dot or fluorescent substance included in the third pattern layer 243' may convert incident light into blue light having a peak wavelength of about 450 nm.

In an exemplary embodiment, where the third pattern layer 243' includes the quantum dot, the quantum dot may include a core structure or a core-shell structure. According to an exemplary embodiment, the quantum dot may include a core including at least one selected from CdS, CdSe, CdTe, ZnS, ZnSe, InAs, ZnSe, ZnO, ZnTe, InP, GaP, InGaN and InN. According to an alternative exemplary embodiment, the quantum dot may include the core and further include a shell surrounding the core. In such an embodiment, the shell may include at least one selected from ZnS, ZnSe, GaP and GaN.

In an exemplary embodiment where the third pattern layer 243' includes the fluorescent substance, the fluorescent substance may be a blue fluorescent substance. In such an embodiment, the blue fluorescent substance may include $BaMgAl_{10}O_{17}$:Eu or $(Sr, Ca, Ba, Mg)_{10}(PO_4)_6Cl_2$:Eu.

The UV light emitted from the backlight unit BLU 2 is incident to the pixel regions A1, A2, and A3. The UV light incident to the pixel regions A1, A2, and A3 may progress toward the color conversion substrate 20' or may be blocked depending on an on/off operation of the LC layer 30. According to an exemplary embodiment, the UV light passed through the LC layer 30 is converted to red light by the quantum dot (or fluorescent substance) of the first pattern layer 241 provided to the first pixel region A1, and the converted red light passes through the first transparent pattern 231 and the first color filter 221, and is emitted to the outside. The UV light passed through the LC layer 30 is converted to green light by the quantum dot (or fluorescent substance) of the second pattern layer 242 provided to the second pixel region A2, and the converted green light passes through the second transparent pattern 232 and the second color filter 222, and is emitted to the outside. The UV light passed through the LC layer 30 is converted to blue light by the quantum dot (or fluorescent substance) provided to the third pixel region A3, and the converted blue light passes through the third transparent pattern 233 and the third color filter 223, and is emitted to the outside.

The red light, the green light and the blue light converted by the quantum dots (or fluorescent substances) of the first to third pattern layers 241, 242, and 243' are emitted toward or along various directions. A reflective filter 260' may be further disposed on the color conversion layer 240 to allow light toward the driving substrate 10 from among the red light, green light, and blue light converted by the quantum dots (or fluorescent substances) to progress toward the second substrate 210. The reflective filter 260' is disposed on one side of the color conversion layer 240 that faces the driving substrate 10, and reflects red light, green light, and blue light. According to an exemplary embodiment, the reflective film 260' may include a plurality of inorganic layers in which a layer of SiOx and/or a layer of SiNx are disposed one on another.

The first to third pattern layers 241, 242, and 243' of the color conversion layer 240 respectively convert incident light into light of predetermined colors, and the converted light passes through the transparent layer 230 and progresses to the color filter layer 220. The first to third color filters 221, 222, and 223 of the color filter layer 220 may have the same colors as the predetermined colors converted by the color conversion layer 240. In one exemplary embodiment, for example, the color of the first color filter 221 is the same as the color (for example, red color) of light converted by the first pattern layer 241, the color of the second color filter 222 is the same as the color (for example, green color) of light converted by the second pattern layer 242, and the color of the third color filter 223 is the same as the color (for example, blue color) of light converted by the third pattern layer 243'. In such an embodiment, as described above, the color filter layer 220 improves color purity and prevents excitation of the quantum dot (or fluorescent substance) by external light.

A method of manufacturing the color conversion substrate 20' of the LCD device 1' illustrated in FIG. 14 may be the same as the method of manufacturing the color conversion substrate described with reference to FIGS. 2 and 13. In one exemplary embodiment, for example, since a process or method of providing the first color conversion portion S1, the second color conversion portion S2 and the third color conversion portion S3 is the same as that described above with reference to FIGS. 2 to 9, and any repetitive detailed description thereof will be omitted.

In an exemplary embodiment of the method of manufacturing the color conversion substrate 20' of the LCD device 1', the process of providing the first to third pattern layers 241, 242 and 243' is the same as that described above with reference to FIGS. 2 to 9, except for the materials of the first to third photosensitive material layers 241p, 242p and 243p as described above with reference to FIG. 14.

Since the color conversion substrate 20' illustrated in FIG. 14 is manufactured via the same method as the method described with reference to FIGS. 2 to 13, a number of masks may be minimized.

Though the inventive concept has been described with reference to exemplary embodiments illustrated in the drawings, these are provided for an exemplary purpose only, and those of ordinary skill in the art will understand that various modifications and other equivalent embodiments may be made therein. Therefore, the spirit and scope of the inventive concept should be defined by the following claims.

What is claimed is:

1. A method of manufacturing a color conversion substrate, the method comprising:
    preparing a substrate on which a first pixel region, a second pixel region and a third pixel region are defined;
    providing a first color conversion portion corresponding to the first pixel region on the substrate;
    providing a second color conversion portion corresponding to the second pixel region on the substrate; and
    providing a third color conversion portion corresponding to the third pixel region on the substrate, wherein
    the providing the first color conversion portion comprises:
    providing a first color filter of a first color corresponding to the first pixel region;
    providing a first transparent pattern corresponding to the first pixel region; and
    providing a first pattern layer corresponding to the first pixel region and comprising a first material which converts light incident thereto into light of the first color,
    wherein the first transparent pattern is provided between the first color filter and the first pattern layer.

2. The method of claim 1, wherein the first material comprises a quantum dot.

3. The method of claim 1, wherein the first color filter and the first pattern layer are provided using a same mask.

4. The method of claim 1, wherein the providing the first pattern layer comprises:
    providing a first photosensitive material layer comprising the first material on the substrate;
    exposing a portion of the first photosensitive material layer using a first mask in which an opening is defined; and
    forming the first pattern layer by removing one of a non-exposed portion and the exposed portion of the first photosensitive material layer.

5. The method of claim 4, wherein the providing the first color filter comprises:
    providing a first photosensitive pigment layer comprising a pigment of the first color on the substrate;
    exposing a portion of the first photosensitive pigment layer using the first mask; and
    forming the first color filter by removing one of a non-exposed portion and the exposed portion of the first photosensitive pigment layer.

6. The method of claim 4, wherein the providing the first transparent pattern comprises:
    providing a transparent material layer on the substrate; and
    patterning the transparent material layer using the first pattern layer corresponding to the first pixel region as a mask.

7. The method of claim 1, wherein the providing the second color conversion portion comprises:
    providing a second color filter of a second color corresponding to the second pixel region;
    providing a second transparent pattern corresponding to the second pixel region; and
    providing a second pattern layer corresponding to the second pixel region and comprising a second material which converts light incident thereto into light of the second color.

8. The method of claim 7, wherein the second transparent pattern is provided between the second color filter and the second pattern layer.

9. The method of claim 7, wherein the second material comprises a quantum dot.

10. The method of claim 7, wherein
    the providing the second pattern layer comprises:
    providing a second photosensitive material layer comprising the second material on the substrate; and
    exposing a portion of the second photosensitive material layer using a second mask, in which an opening is defined, and
    the providing the second color filter comprises:
    providing a second photosensitive pigment layer comprising a pigment of the second color on the substrate; and
    exposing a portion of the second photosensitive pigment layer using the second mask.

11. The method of claim 10, wherein the portion of the second photosensitive material layer and the portion of the second photosensitive pigment layer are simultaneously exposed using the second mask.

12. The method of claim 1, wherein the providing the third color conversion portion comprises:
    providing a third color filter of a third color corresponding to the third pixel region;

providing a third transparent pattern corresponding to the third pixel region; and providing a third pattern layer corresponding to the third pixel region.

13. The method of claim 12, wherein the third pattern layer has light transmittance such that light incident thereto is transmitted therethrough.

14. The method of claim 13, wherein the third pattern layer comprises a scatterer.

15. The method of claim 13, wherein the third pattern layer comprises a third material which converts light incident thereto into light of the third color.

16. The method of claim 1, further comprising:
providing a light-shielding layer between adjacent pixel regions from among the first pixel region, the second pixel region and the third pixel region.

17. The method of claim 1, further comprising:
providing a reflective filter on the first color conversion portion.

18. The method of claim 1, wherein the reflective filter covers the first pixel region, the second pixel region and the third pixel region.

\* \* \* \* \*